US008755034B2

(12) United States Patent
Ahn et al.

(10) Patent No.: US 8,755,034 B2
(45) Date of Patent: Jun. 17, 2014

(54) MASKLESS EXPOSURE APPARATUS AND METHOD TO DETERMINE EXPOSURE START POSITION AND ORIENTATION IN MASKLESS LITHOGRAPHY

(75) Inventors: Sung Min Ahn, Suwon-si (KR); Sang Don Jang, Suwon-si (KR); Tae Kyu Son, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 323 days.

(21) Appl. No.: 13/185,863

(22) Filed: Jul. 19, 2011

(65) Prior Publication Data
US 2012/0081682 A1 Apr. 5, 2012

(30) Foreign Application Priority Data

Oct. 1, 2010 (KR) .................. 10-2010-0095939

(51) Int. Cl.
*G01B 11/00* (2006.01)
*G01B 11/14* (2006.01)
*G03B 27/32* (2006.01)
*G03F 7/20* (2006.01)
*G03F 9/00* (2006.01)

(52) U.S. Cl.
CPC ........ *G03F 7/70633* (2013.01); *G03F 7/70291* (2013.01); *G03F 9/70* (2013.01)
USPC .............. 355/77; 356/401; 356/615; 356/620

(58) Field of Classification Search
CPC ............ G03F 7/70291; G03F 7/70633; G03F 7/70775; G03F 9/70; G03F 9/7003; G03F 9/7019
USPC ........ 355/53, 67, 77; 356/399–401, 614–616, 356/620
See application file for complete search history.

(56) References Cited

U.S. PATENT DOCUMENTS

2002/0111038 A1* 8/2002 Matsumoto et al. .......... 438/763
2006/0177146 A1* 8/2006 Miyashita ..................... 382/255

FOREIGN PATENT DOCUMENTS

JP  2010122526 A  6/2010

OTHER PUBLICATIONS

"An Introduction to Lithography—Overlay;" ASML Papers, 2012.*

*Primary Examiner* — Toan Ton
*Assistant Examiner* — Colin Kreutzer
(74) *Attorney, Agent, or Firm* — Harness, Dickey & Pierce, PLC

(57) ABSTRACT

According to an example embodiment, a method to determine an exposure start position and orientation includes loading a substrate on a moving table. The substrate includes at least one alignment mark of a first set of alignment marks of a first pattern layer patterned thereon. At least one alignment mark of a second set of alignment marks of a second pattern layer is exposed on the substrate using maskless lithography. A position of the at least one alignment mark of the first set of alignment marks and a position of the at least one alignment mark of the second set of alignment marks on the substrate is measured. A relative orientation difference between a desired exposure start orientation and an obtained exposure start orientation is acquired using the measured positions of the at least one alignment mark of the first set of alignment marks and the at least one alignment mark of the second set of alignment marks. A relative position difference between a desired exposure start position and an obtained start position is acquired using the measured positions of the at least one alignment mark of the first set of alignment marks and the at least one alignment mark of the second set of alignment marks. An exposure start position and orientation compensated using the relative position difference and the relative orientation difference is determined.

12 Claims, 16 Drawing Sheets

MASKLESS EXPOSURE APPARATUS AND METHOD TO DETERMINE EXPOSURE START POSITION AND ORIENTATION IN MASKLESS LITHOGRAPHY

CROSS-REFERENCE TO RELATED APPLICATION

This application claims priority under 35 U.S.C. §119 to Korean Patent Application No. 2010-0095939, filed on Oct. 1, 2010 in the Korean Intellectual Property Office, the entire disclosure of which is incorporated herein by reference.

BACKGROUND

1. Field

Example embodiments relate to a method to determine an exposure start position and orientation of a substrate in maskless lithography and/or an apparatus to determine the exposure start position and orientation.

2. Description of the Related Art

Generally, a method to form a pattern on a substrate (or a semiconductor wafer) constituting a Liquid Crystal Display (LCD), Plasma Display Panel (PDP), or a Flat Panel Display (FPD) includes applying a pattern material to the substrate, selectively exposing the pattern material using a photo-mask, and selectively removing a part of the pattern material, chemical properties of which are changed, or the remaining part, so as to form a pattern.

However, as a substrate size increases and pattern feature widths become increasingly narrow, a maskless lithography method to form a desired pattern on a substrate (or a semiconductor wafer) without using a photo-mask has been developed. Maskless lithography has several advantages, for example, free design of a panel without mask fabrication/washing/storage costs, reduced lead time due to elimination of a mask fabrication process, no mask defects, no process loss, and increased production flexibility due to hybrid layout.

In such maskless lithography, accurately forming a pattern in a required exposure region of the substrate may require loading and orienting the substrate to coincide with an exposure scan direction (orientation) after assembly of equipment. Here, the equipment includes, for example, a loader to load or unload the substrate and a measurement system to measure an exposure start position and orientation of the substrate.

However, assembling equipment to coincide the loading and orientation of the substrate with the exposure scan direction is difficult. Therefore, it may be desirable to locate an exposure start position and orientation of the substrate.

SUMMARY

According to an example embodiment, a method to determine an exposure start position and orientation includes loading a substrate on a moving table. At least one alignment mark of a first set of alignment marks of a first pattern layer is patterned on the substrate. At least one alignment mark of a second set of alignment marks of a second pattern layer is exposed using maskless lithography. A position of the at least one alignment mark of the first set of alignment marks and a position of the at least one alignment mark of the second set of alignment marks on the substrate is measured. A relative orientation difference between a desired exposure start orientation and an obtained exposure start orientation is acquired using the measured positions of the at least one alignment mark of the first set of alignment marks and the at least one alignment mark of the second set of alignment marks. A relative position difference between a desired exposure start position and an obtained start position is acquired using the measured positions of the at least one alignment mark of the first set of alignment marks and the at least one alignment mark of the second set of alignment marks. An exposure start position and orientation compensated using the relative position difference and the relative orientation difference is determined.

According to an example embodiment, the method further includes providing as the substrate at least one of a reference substrate having the first pattern layer thereon, and a substrate exposed to the first pattern layer in a separate exposure apparatus for Multi Machine Overlay (MMO).

According to an example embodiment, the method, further includes providing the first pattern layer including information required to locate the exposure start position and orientation.

According to an example embodiment, the acquiring the relative orientation difference between the desired exposure start orientation and the obtained exposure start orientation using the measured positions of the at least one alignment mark of the first set of alignment marks and the at least one alignment mark of the second set of alignment marks includes, acquiring a difference between the desired exposure start orientation and the obtained exposure start orientation after assembly of exposure equipment based on the equation $\Delta\theta = -[\arg(^{MS}r_{12} - ^{MS}r_{11}) - \arg(^{MS}r_{22} - ^{MS}r_{21})]\text{w.r.t}\Sigma_0$ In the equation, "$^{MS}r_{12}$" is a position of a first alignment mark of the first set of alignment marks of the first pattern layer. "$^{MS}r_{11}$" is a position of a second alignment mark of the first set of alignment marks of the first pattern layer. "$^{MS}r_{22}$" is a position of a first alignment mark of the second set of alignment marks of the second pattern layer. "$^{MS}r_{11}$" is a position of a second alignment mark of the second set of alignment marks of the second pattern layer. The position of the first alignment mark of the first set of alignment marks is measured based on a measurement coordinate system. The position of the second alignment mark of first set of alignment marks is measured based on the measurement coordinate system. The position of the first alignment mark of the second set of alignment marks is measured based on the measurement coordinate system. The position of the second alignment mark of the second set of alignment marks is measured based on the measurement coordinate system.

According to an example embodiment, the method further includes compensating for the exposure start orientation of the substrate using the relative orientation difference, repeatedly loading and exposing the substrate after compensating for the exposure start orientation of the substrate, and measuring a position of the at least one alignment mark of the first set of alignment marks and a position of the at least one alignment mark of the second set of alignment marks on the substrate after completion of the repeated exposure of the substrate According to an example embodiment, the acquiring the relative position difference between the desired exposure start position and the obtained start position using the measured positions of the at least one alignment mark of the first set of alignment marks and the at least one alignment mark of the second set of alignment marks includes acquiring a difference between the desired exposure start position and the obtained exposure start position after assembly of equipment based on the kinematic relationship between the repeatedly measured positions of the at least one alignment mark of the first set of alignment marks and the at least one alignment mark of the second set of alignment marks.

According to an example embodiment, the method further includes compensating for a difference between the desired exposure start position and orientation and the obtained exposure start position and orientation after assembly of the exposure equipment, and after exposing the at least one alignment mark of the first set of alignment marks on the first pattern layer.

According to an example embodiment, the method further includes compensating for the difference between the desired exposure start position and orientation and the obtained exposure start position and orientation after assembly of the exposure equipment and after exposing a pattern layer on another substrate on which an alignment mark is not formed.

According to an example embodiment, the determining the exposure start position and orientation compensated using the relative position difference and the relative orientation difference includes, acquiring a compensation command value with respect to the obtained exposure start position and orientation using the following equations by compensating for a desired command value with respect to the obtained start position and orientation using the relative position and orientation differences, $$^S p_{cmd} = {}^S p_n = \begin{bmatrix} {}^S \begin{bmatrix} X_n \\ Y_n \\ \theta_n \end{bmatrix} \end{bmatrix} \text{ and}$$

$$^S p'_{cmd} = {}^S p_{cmd} + \begin{bmatrix} \Delta X \\ \Delta Y \\ \Delta \theta \end{bmatrix} = {}^S p_n + \begin{bmatrix} \Delta X \\ \Delta Y \\ \Delta \theta \end{bmatrix} = {}^S \begin{bmatrix} X_n \\ Y_n \\ \theta_n \end{bmatrix} + \begin{bmatrix} \Delta X \\ \Delta Y \\ \Delta \theta \end{bmatrix}$$

According to an example embodiment, a maskless exposure apparatus includes, a stage configured to receive a substrate on a moving table of the stage. The stage is configured to move the substrate in X-, Y- and θ-directions. The substrate includes a pattern layer. The apparatus further includes a light modulation element configured to expose the pattern on the substrate using a beam spot array of exposure beams, a measurement system configured to measure a position of an alignment mark previously patterned on the substrate and a position of an alignment mark of the pattern exposed on the substrate. The apparatus also includes a control unit configured to acquire a relative orientation difference between a desired exposure start orientation and an obtained orientation using the measured positions of the alignment marks and a relative position difference between a desired exposure start position and an obtained position using the measured positions of the alignment marks, and determine an exposure start position and orientation compensated using the relative orientation difference and the relative position difference.

According to an example embodiment, the substrate includes at least one of a reference substrate having the pattern layer and a substrate exposed to the first pattern layer in a separate exposure apparatus for Multi Machine Overlay (MMO).

According to an example embodiment, the substrate having the pattern layer includes pattern information required to locate the exposure start position and orientation.

According to an example embodiment, the measurement system includes at least one of a non-contact Coordinate Measuring Machine (CMM) and an Alignment Scope Unit (ASU).

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
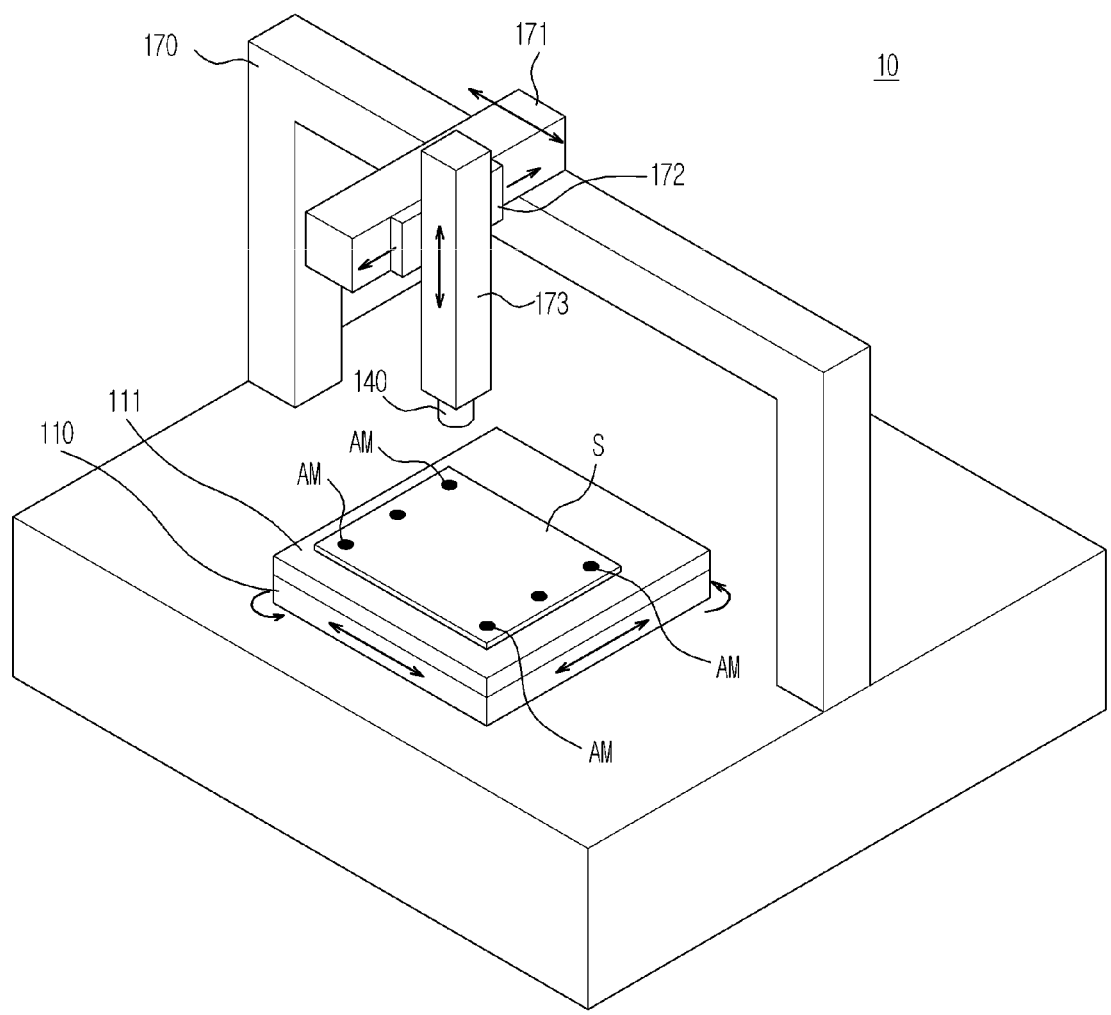
FIG. 1 is a view illustrating the overall configuration of a measurement system according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
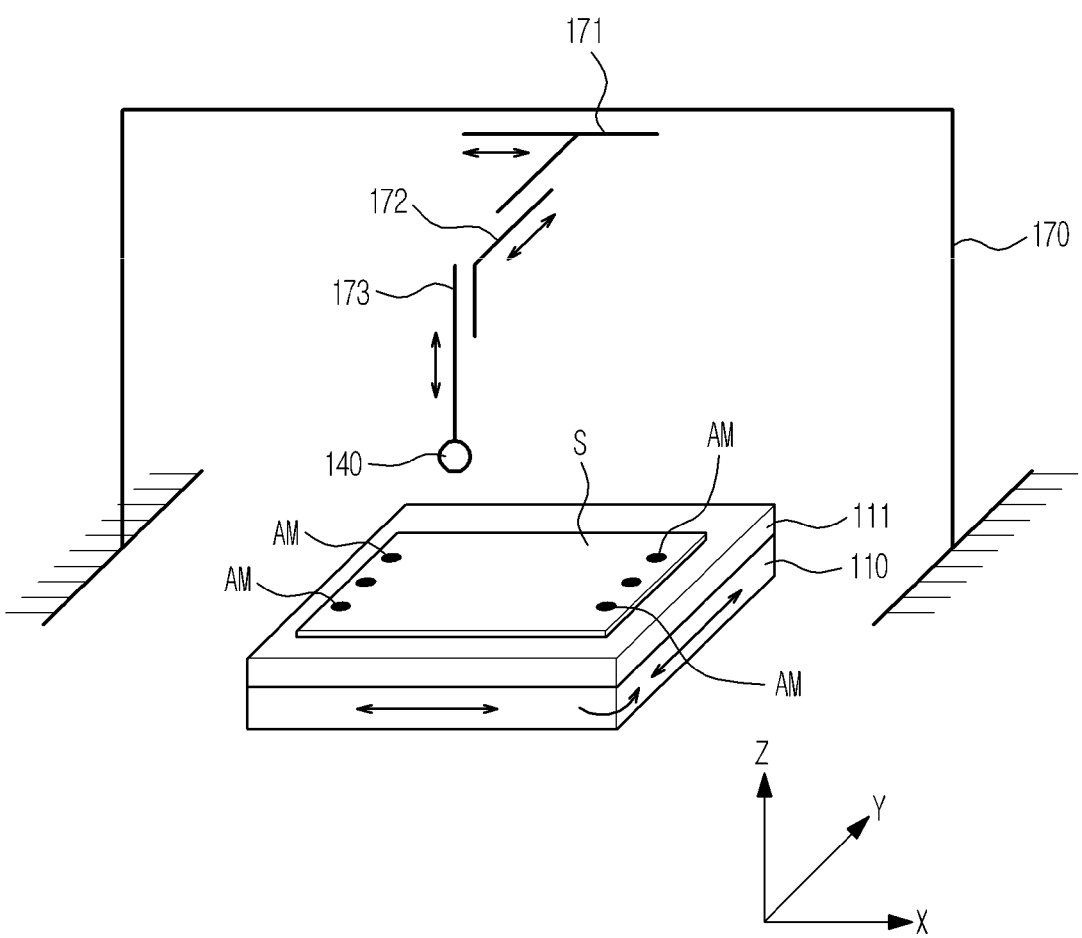
FIG. 2 is a conceptual view illustrating operation of the measurement system according to an example embodiment.

FIG. 1 is a view illustrating the overall configuration of a measurement system according to an embodiment of the present invention, and FIG. 2 is a conceptual view illustrating operation of the measurement system according to an example embodiment.

In FIGS. 1 and 2, the measurement system 10 according to an example embodiment includes a moving table 111 on which a substrate S (for example, a semiconductor wafer, a glass substrate, or other substrates on which a predetermined or desired pattern is formed) is placed, and a measurement unit 140 installed over the moving table 111 to measure a position and orientation of the substrate S placed on the moving table 111. The measurement unit 140 is installed on a gantry 170 such that the measurement unit 140 is movable in X-, Y- and Z-directions.

The gantry 170 is provided with moving members 171, 172 and 173 in the form of guide bars that move in X-, Y- and Z-directions. The measurement unit 140 is coupled to the moving members 171, 172 and 173 such that the measurement unit 140 moves in X-, Y- and Z-directions. The measurement unit 140 generally has 3-degrees of freedom and the movement of the measurement unit 140 may be restricted in a desired degree of freedom. For example, various combinations of X-, Y- or Z-direction may be possible.

As described above, the measurement unit 140 has 3-degrees of freedom to move in X-, Y- and Z-directions according to operations of the moving members 171, 172 and 173. The moving table 111 on which the substrate S is placed also has 3-degrees of freedom X, Y and θ so as to move in X-, Y- and θ-directions according to operation of a stage 110.

Figure 3:
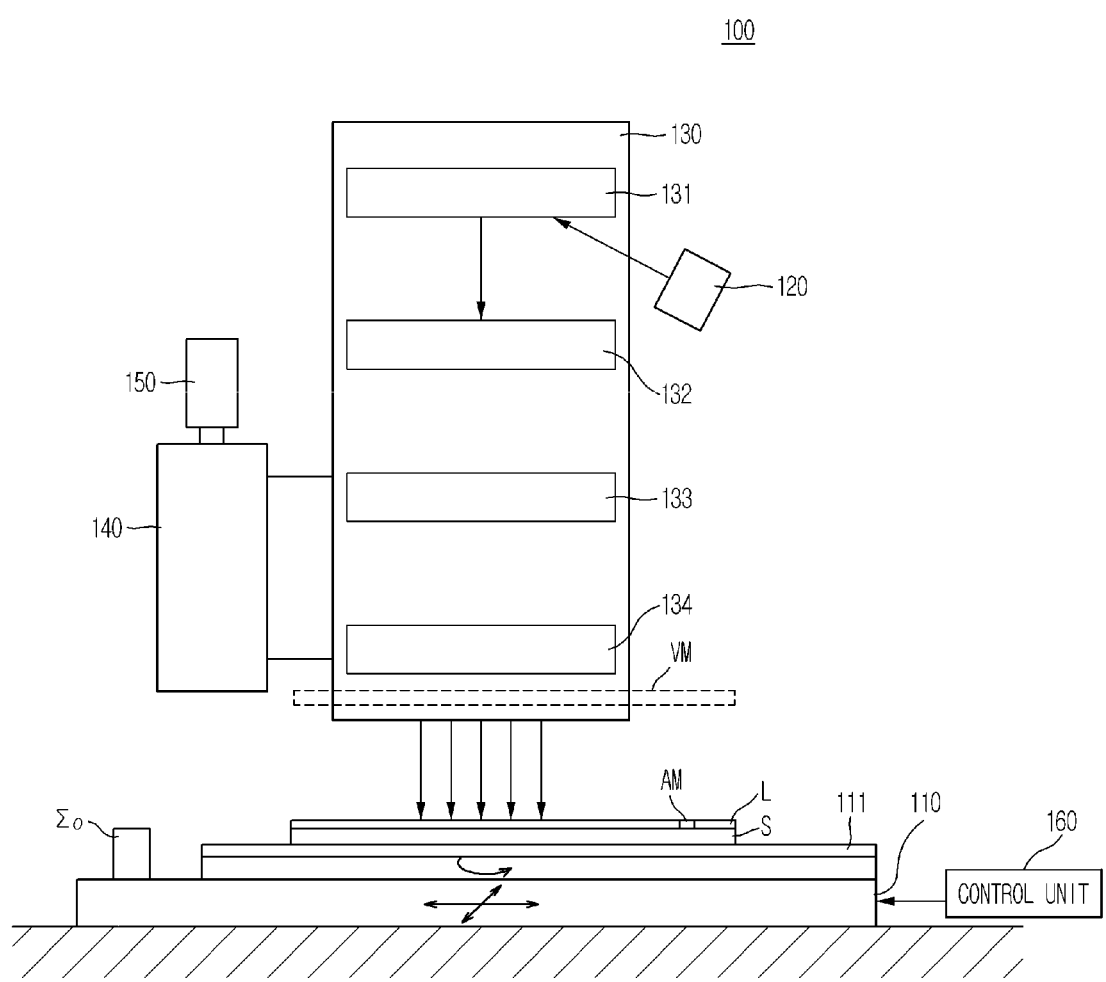
FIG. 3 is a view illustrating the overall configuration of a maskless exposure apparatus according to an example embodiment.

FIG. 3 is a view illustrating the overall configuration of a maskless exposure apparatus according to an example embodiment.

In FIG. 3, the maskless exposure apparatus 100 according to an example embodiment includes the stage 110, a light source unit 120, an optic head 130, the measurement unit 140, a mark imaging unit 150, and a control unit 160.

The stage 110 serves to convey the moving table 111, on which the substrate S to be exposed is placed, in X-, Y- and θ-directions. In maskless lithography, to locate an obtained exposure start position and orientation of the substrate S, the stage 110 conveys the moving table 111, on which the substrate S has been loaded, in a given direction (for example, an exposure scan direction, or a direction perpendicular to the exposure scan direction) based on an instruction from the control unit 160.

Here, the substrate S has a pattern layer L, which contains pattern information to locate an exposure start position and orientation of the substrate S and allows an alignment mark AM (for example, a reference mark upon overlay exposure alignment) to be formed on the substrate S via an exposure process. At least one alignment mark AM is present in the pattern layer L on the substrate S.

The light source unit 120 serves to output laser light for exposure, and may include, for example, a semiconductor laser or ultraviolet lamp. The laser light is transmitted to the substrate S placed on the stage 110 through the optic head 130.

The optic head 130 is installed at a stationary position on the stage 110, and serves to project pattern-forming light in the form of a plurality of spot beams on the substrate S so as to form a pattern of a Virtual Mask VM.

The optic head 130 includes a light modulation element 131 to modulate the light output from the light source unit 120 into the light containing the pattern of the virtual mask VM, a first projection lens 132 to magnify the light modulated by the light modulation element 131, a Multi-Lens Array (MLA) 133 in the form of an array of a plurality of lenses, the multi-lens array serving to split the light containing the pattern of the virtual mask VM, magnified by the first projection lens 132, into a plurality of beams and condense the split beams, and a second projection lens 134 to pass the light condensed by the multi-lens array 133 after adjusting brightness of the condensed light.

The light modulation element 131 includes a Spatial Light Modulator (SLM). Examples of the light modulation element 131 may include a Micro Electro Mechanical System (MEMS) type Digital Micro-Mirror Device (DMD), a 2-dimensional Grating Light Valve (GLV), an electro-optic device using Lead Zirconate Titantate (PLZT) as transparent ceramics, and Ferroelectric Liquid Crystals (FLC). In an example embodiment, the light modulation element 131 may be a DMD. Hereinafter, for convenience of description, the example embodiment will be described based on the light modulation element 131 to include a DMD.

A DMD is a mirror device composed of a memory cell and a plurality of micro-mirrors arranged in an L×M matrix on the memory cell. Angles of the respective micro-mirrors are changed based on control signals produced according to image data, such that desired beams are reflected and transmitted to the first projection lens 132 and the other beams are transmitted and intercepted at different angles.

If a digital signal is recorded in the memory cell of the light modulation element 131 in the form of a DMD, the micro-mirrors are tilted in a range of a desired or defined angle (for example, ±12°) about a diagonal line. On/Off states of the respective micro-mirrors are controlled by the control unit 160 that will be described hereinafter. Light reflected by the micro-mirrors in an On state acts to expose an object on the substrate S (normally, a photoresist (PR)), whereas light reflected by the micro-mirrors in an Off state is not incident upon the object on the substrate S.

The first projection lens 132 is formed of, for example, a double telecentric optical system, and serves to magnify an image, having passed through the light modulation element 131, at a magnification of about 4×, so as to form the resultant image on an aperture plane of the multi-lens array 133.

The second projection lens 134 is also formed of a double telecentric optical system, for example, and serves to focus a plurality of spot beams, formed on a focal surface of the multi-lens array 133, on the substrate S at a magnification of about 1×. Although, in the example embodiment, the first projection lens 132 and the second projection lens 134 respectively have magnifications of about 4× and about 1×, the example embodiment is not limited thereto. The magnifications of the first and second projection lenses 132 and 134 may be chosen according to a desired magnitude of spot beams and a minimum feature size of a pattern to be exposed.

The multi-lens array 133 includes a plurality of micro-lenses, which are two-dimensionally arranged to correspond to the micro-mirrors of the light modulation element 131. For example, if the light modulation element 131 includes micro-mirrors in a 1920×400 array, the multi-lens array 133 includes the micro-lenses in a 1920×400 array. Also, an arrangement pitch of the micro-lenses may be substantially equal to a value obtained by multiplying the magnification of the first projection lens 132 by an arrangement pitch of the micro-mirrors of the light modulation element 131.

The optic head 130 produces a virtual mask VM having a pattern formed by the plurality of spot beams transmitted through the second projection lens 134.

The virtual mask VM is not a physical mask, but is formed as the light modulation element 131 is turned on or off to form a pattern corresponding to a previously stored pattern using a plurality of spot beams. The virtual mask VM is equal in size to a pattern that will be formed on the substrate S by scanning the stage 110 in a main scan direction (Y-direction) and stepping the stage 110 in a sub scan direction (X-direction).

In operation of the maskless exposure apparatus 100 having the above described configuration, if the light source unit 120 outputs light, the light modulation element 131 modulates the output light of the light source unit 120 into light containing the pattern of the virtual mask VM. Then, the first projection lens 132 magnifies the light containing the pattern of the virtual mask VM modulated by the light modulation element 131. The multi-lens array 133 splits the magnified light containing the pattern of the virtual mask VM into a plurality of spot beams, and then, condenses the spot beams. Then, as the second projection lens 134 transmits the light condensed by the multi-lens array 133 after adjusting lightness of the light, an exposure operation is performed.

The measurement system 10 includes the stage 110 and the measurement unit 140 provided on the stage 110. The measurement system 10 utilizes a non-contact Coordinate Measuring Machine (CMM), for example, which serves to measure a position of the alignment mark AM formed on the substrate S placed on the moving table 111 of the stage 110.

The measurement system 10 may be replaced by an off-axis type Alignment Scope Unit (ASU) using the measurement unit 140 of the maskless exposure apparatus 100.

The mark imaging unit 150 is provided on the measurement unit 140, and obtains images of the alignment mark AM formed on the substrate S, for example, on the pattern layer L on the substrate S. Then, the mark imaging unit 150 transmits the formed image to the control unit 160, to locate an obtained exposure start position and orientation. In this case, movement of the stage 110 is controlled to convey the moving table 111, on which the substrate S has been loaded, in a given direction (for example, an exposure scan direction, or a direction perpendicular to the exposure scan direction) according to an instruction of the control unit 160.

The control unit 160 determines an obtained exposure start position and orientation of a substrate by acquiring relative position and orientation differences with respect to each alignment mark AM utilizing the kinematic relationship between the positions of two or more alignment marks AM measured by the measurement unit 140 and compensating for the acquired relative position and orientation differences from a nominal or desired exposure start position and orientation.

Accordingly, the control unit 160 may compensate for relative position and orientation differences from an exposure start position and orientation upon setup of equipment.

Although the example embodiment describes the maskless exposure apparatus 10 using the virtual mask VM, example embodiments are not limited thereto, and are applicable to a masked exposure apparatus.

Hereinafter, a method to locate an obtained exposure start position and orientation after assembly of equipment for overlay exposure in maskless lithography will be described. As will be appreciated, the obtained exposure start position and orientation may be the actual exposure start position and orientation.

Figure 4:
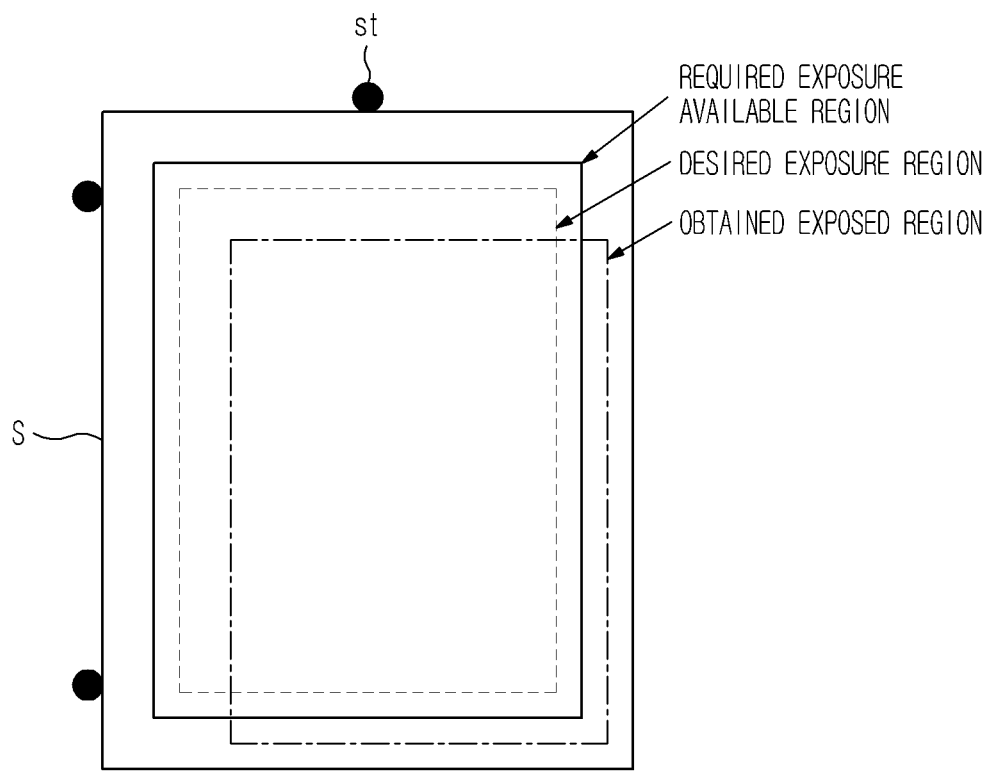
FIG. 4 is a view illustrating a case in which an exposed region of a substrate deviates from a required exposure available region upon Single Machine Overlay (SMO) in maskless lithography according to an example embodiment.

FIG. 4 is a view illustrating a case in which an exposed region of a substrate deviates from a required exposure available region upon Single Machine Overlay (SMO) in maskless lithography according to an example embodiment.

In FIG. 4, the substrate S to be exposed includes a required exposure available region as illustrated by the solid line, and, the exposure available region includes a nominal or desired exposure region containing a nominal or desired exposure start position and orientation.

In maskless lithography, after assembly of equipment including a loader to load or unload the substrate S and the measurement unit 140 to measure an exposure start position and orientation of the substrate S, it may be desirable to orient the loaded substrate S such that the orientation of the substrate S coincides with an exposure scan direction (orientation), in order to accurately form a pattern in the required exposure available region of the substrate S.

However, upon equipment assembly, the orientation of the substrate S generally does not coincide with the exposure scan direction. As illustrated in FIG. 4, an exposed region obtained on the basis of the nominal or desired exposure region deviates from the required exposure available region of the substrate S.

FIG. 4 illustrates a case in which the exposed region obtained deviates from the nominal or desired exposure region in X- and Y-directions (Δθ=0). In FIG. 4, reference letters "st" designate a stopper for kinematic clamping to assure loading repetition accuracy of the substrate S upon planar movement.

Figure 5:
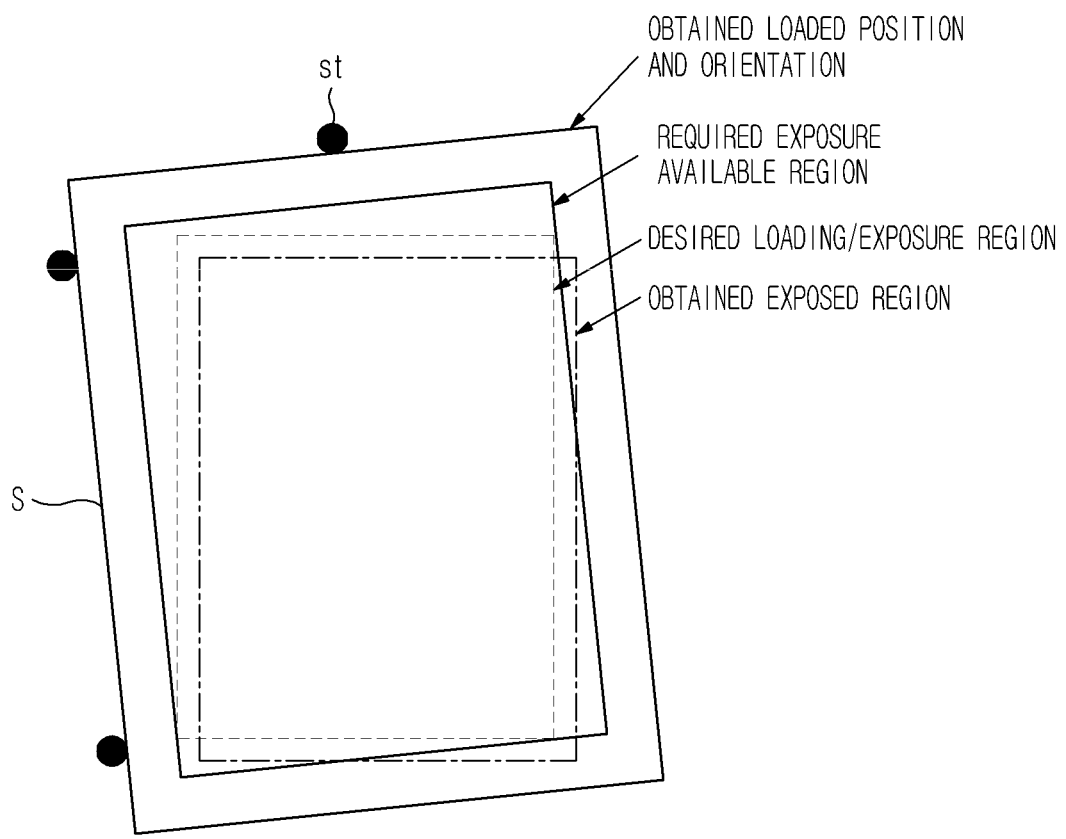
FIG. 5 is a view illustrating a case in which an obtained loaded position and orientation of a substrate differ from desired values due to kinematic factors in maskless lithography according to an example embodiment.

FIG. 5 is a view illustrating a case in which an obtained loaded position and orientation of a substrate differ from desired values due to kinematic factors (processing, assembly, etc.) in maskless lithography according to an example embodiment.

In FIG. 5, the substrate S to be exposed includes a required exposure available region as illustrated by the solid line. An exposure start position and orientation of the substrate S differ from a nominal or desired exposure region due to kinematic factors (for example, of the optic head), such as processing, assembly, etc.

FIG. 5 illustrates a general case caused upon assembly of equipment, in which an obtained exposed region deviates from the nominal or desired exposure region in X-, Y- and θ-directions (Δθ≠0).

In FIG. 5, the loaded position and orientation of the substrate S differ from nominal or desired values due to kinematic factors, and the exposed region obtained also differs from the nominal or desired exposure region due to kinematic factors of the optic head 130. Since the optic head 130 is stationary and the stage 110 is movable, relative orientation and relative position differences Δθ, ΔX and ΔY are acquired to coincide the loaded position and orientation with the obtained exposed region, and an exposure start position and orientation are compensated using the relative orientation and relative position differences Δθ, ΔX and ΔY and the stage 110.

Figure 6:
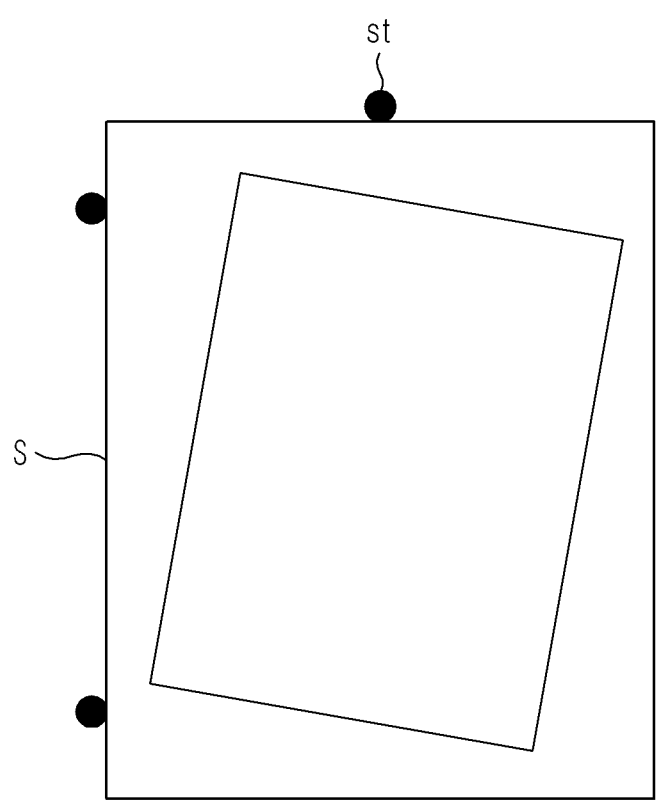
FIG. 6 is a view illustrating a case in which a substrate is loaded in an additional compatible exposure apparatus for Machine-to-Machine Overlay (MMO) or Multi-Machine Overlay (MMO) in maskless lithography according to an example embodiment.

FIG. 6 is a view illustrating a case in which a substrate is loaded in an additional compatible exposure apparatus for Machine-to-Machine Overlay (MMO) or Multi-Machine Overlay (MMO) in maskless lithography according to an example embodiment. In other words, the substrate S, which has been exposed as illustrated in FIG. 5, may be loaded in the additional exposure apparatus for Machine-to-Machine Overlay (MMO) or Multi-Machine Overlay (MMO) in maskless lithography.

Generally, the additional exposure apparatus for MMO has a limited stroke within each degree of freedom. In particular, to be compatibly used in the additional exposure apparatus for MMO, it may be needed for an exposure start position and orientation of the substrate to fall within an allowable angular stroke. If the substrate S loaded in the additional exposure apparatus for MMO deviates from the angular stroke of the exposure apparatus in FIG. 6, implementation of overlay exposure is relatively difficult.

Figure 7:
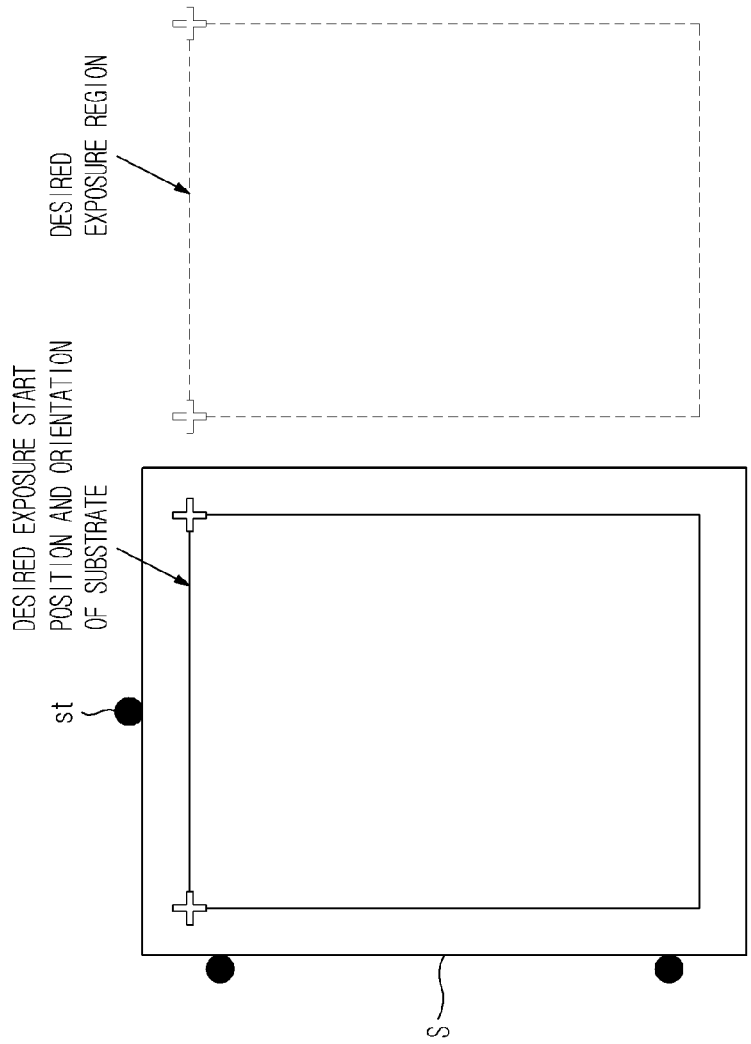
FIG. 7 is a view illustrating an ideal case in which a desired exposure start position and orientation of a substrate coincide with a desired exposure region in maskless lithography according to an example embodiment.
Figure 7:
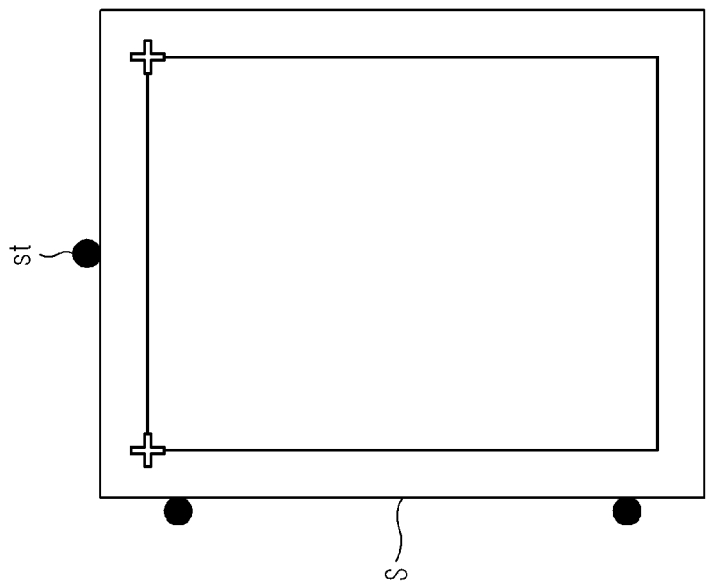

FIG. 7 is a view illustrating an ideal case in which a nominal or desired exposure start position and orientation of a substrate coincide with a nominal or desired exposure region in maskless lithography according to an example embodiment.

In FIG. 7, the right side of the drawing illustrates overlapped regions of the left side of the drawing, for example, the nominal or desired exposure start position and orientation of the substrate and the nominal or desired exposure region.

Figure 8:
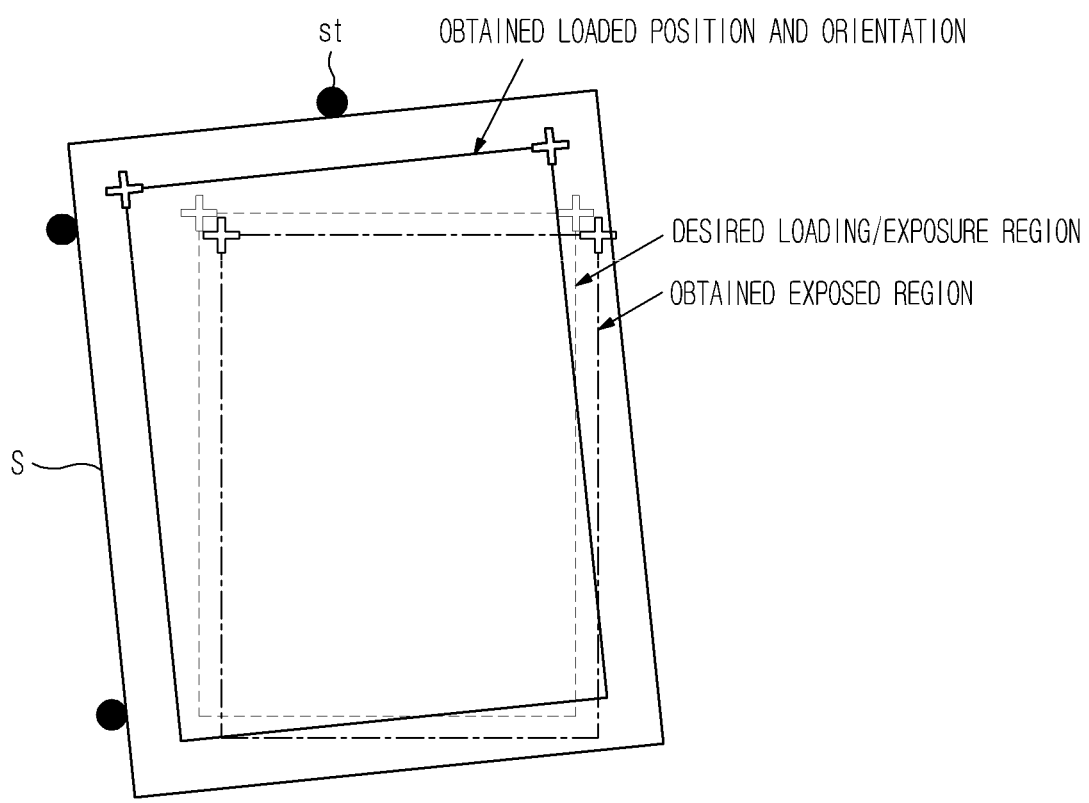
FIG. 8 is a view illustrating a general case in which an obtained loaded position and orientation of a substrate do not coincide with an obtained exposed region although it is necessary for a desired exposure start position and orientation of a substrate to coincide with a desired exposure region in maskless lithography according to an example embodiment.

FIG. 8 is a view, according to an example embodiment, illustrating a general case in which an actually loaded position and orientation of a substrate do not coincide with an obtained exposed region although it may be desirable for a nominal or desired exposure start position and orientation of a substrate to coincide with a nominal or desired exposure region in maskless lithography.

In FIG. 8, such misalignment occurs due to kinematic factors, such as processing, assembly, for example.

Figure 9:
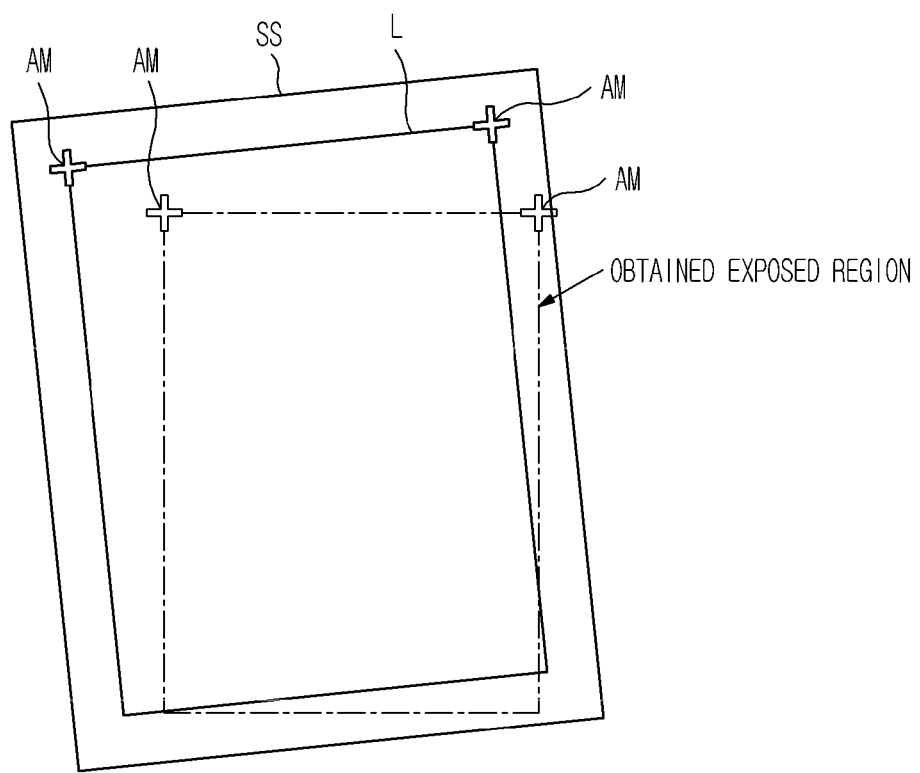
FIG. 9 is a view illustrating the result of FIG. 8 confirmed by loading, exposing and developing a reference substrate in maskless lithography according to an example embodiment.
Figure 9:
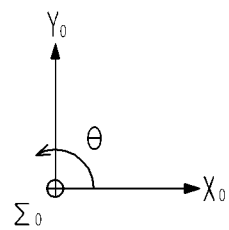

FIG. 9 is a view illustrating the result of FIG. 8 obtained by loading, exposing and developing a reference substrate SS in maskless lithography according to an example embodiment.

In FIG. 9, the reference substrate SS may have a pattern layer L thereon, or may be exposed to the pattern layer L in a separate compatible exposure apparatus for MMO. The pattern layer L contains pattern information to locate an exposure start position and orientation.

The alignment mark AM may be included on a previously patterned region of the reference substrate SS, and may be formed on a newly patterned region, for example, on an obtained exposed region.

In FIG. 9, physical parameters defined to check whether or not the nominal or desired exposure start position and orientation of the substrate coincide with the nominal or desired exposure region are as follows.

"$\Sigma_0(X_0, Y_0, \theta)$" is a reference coordinate system (hereinafter, referred to as an overlay coordinate system) for implementation of overlay exposure via acquisition of a position and orientation of the substrate S placed on the moving table 111, and is provided on the stage 110.

Figure 10:
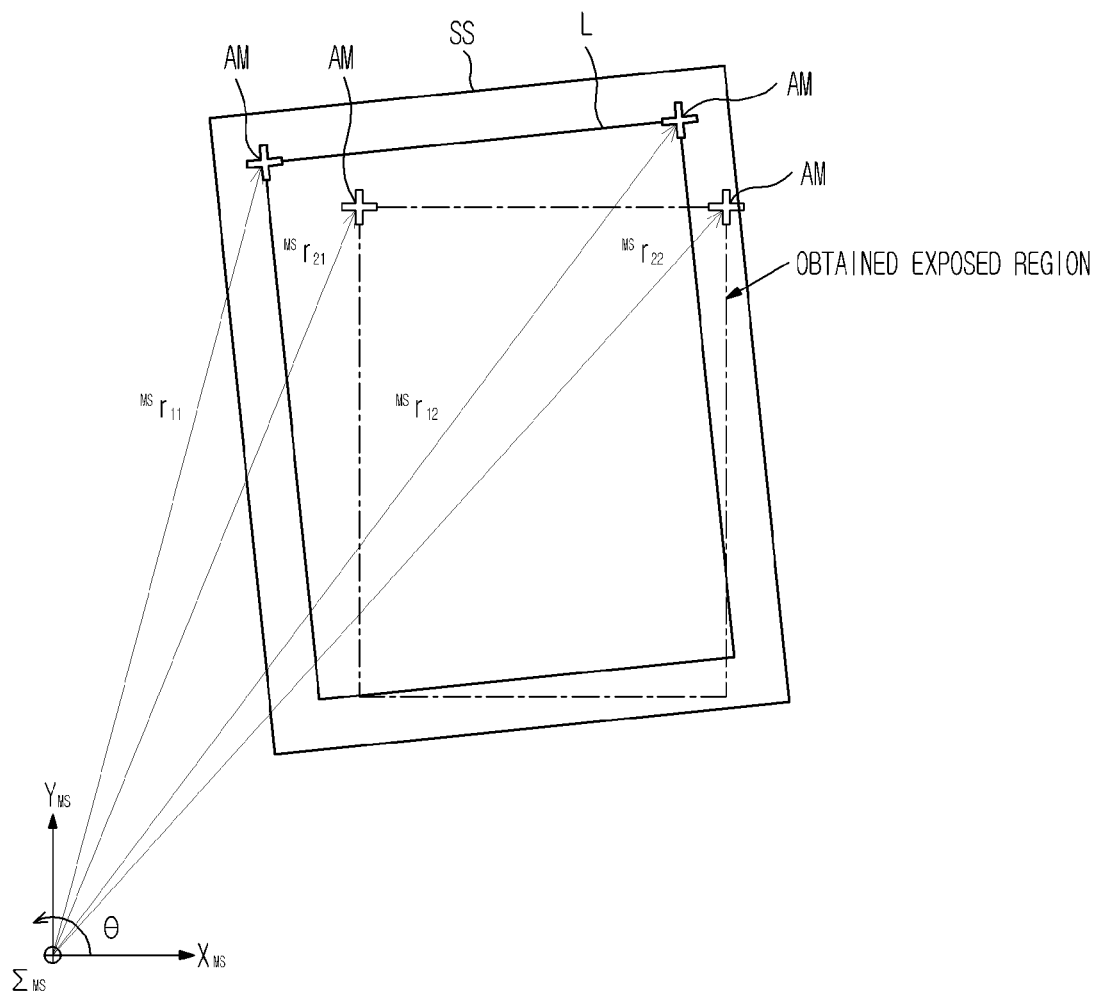
FIG. 10 is a view defining a position vector of a mark and a coordinate system with respect to the result of FIG. 9.

FIG. 10 is a view defining a position vector of a mark and a coordinate system with respect to the result of FIG. 9.

In FIG. 10, after the reference substrate SS, which has been subjected to loading, exposure and developing processes, is placed on the measurement system 10, positions of alignment marks AM previously patterned on the reference substrate SS and positions of newly patterned alignment marks AM are measured using the measurement unit 140. Physical parameters defined to measure the alignment marks AM are as follows.

"$\Sigma_S(X_S, Y_S, \theta)$" is a positional coordinate system of the moving table 111 of the stage 110 (hereinafter, referred to as a stage coordinate system).

"$\Sigma_{MS}(X_{MS}, Y_{MS}, \theta)$" is a body-fixed coordinate system of the measurement system 10 (hereinafter, referred to as a measurement coordinate system).

Positions of the respective alignment marks AM measured based on the measurement coordinate system $\Sigma_{MS}$ are as follows.

"$^{MS}r_{ij}$" is a position of a $j^{th}$ alignment mark AM of an $i^{th}$ layer measured based on the measurement coordinate system $\Sigma_{MS}$.

"$^{o}r_{ij}$" is a position of the $j^{th}$ alignment mark AM of the $i^{th}$ layer measured based on the overlay coordinate system $\Sigma_o$.

A difference between an obtained orientation and a nominal or desired exposure start orientation will be acquired via the following Equation 1 using positions of the respective alignment marks AM measured based on the measurement coordinate system $\Sigma_{MS}$, i.e. positions $^{MS}r_{12}$ and $^{MS}r_{11}$ of the previously patterned alignment marks AM and positions $^{MS}r_{22}$ and $^{MS}r_{21}$ of the newly patterned alignment marks AM.

$$\Delta\theta = -[\arg(^{MS}r_{12} - {}^{MS}r_{11}) - \arg(^{MS}r_{22} - {}^{MS}r_{21})] \text{w.r.t} \Sigma_0 \quad \text{Equation 1}$$

In Equation 1, "$^{MS}r_{12}$" is a position of a $2^{nd}$ alignment mark AM of a $1^{st}$ layer measured based on the measurement coordinate system $\Sigma_{MS}$, "$^{MS}r_{11}$" is a position of a $1^{st}$ alignment mark AM of the $1^{st}$ layer measured based on the measurement coordinate system $\Sigma_{MS}$, "$^{MS}r_{22}$" is a position of a $2^{nd}$ alignment mark AM of a $2^{nd}$ layer measured based on the measurement coordinate system $\Sigma_{MS}$, and "$^{MS}r_{21}$" is a position of a $1^{st}$ alignment mark AM of the $2^{nd}$ layer measured based on the measurement coordinate system $\Sigma_{MS}$.

In this way, the relative orientation difference Δθ to be compensated may be acquired via Equation 1.

Figure 11:
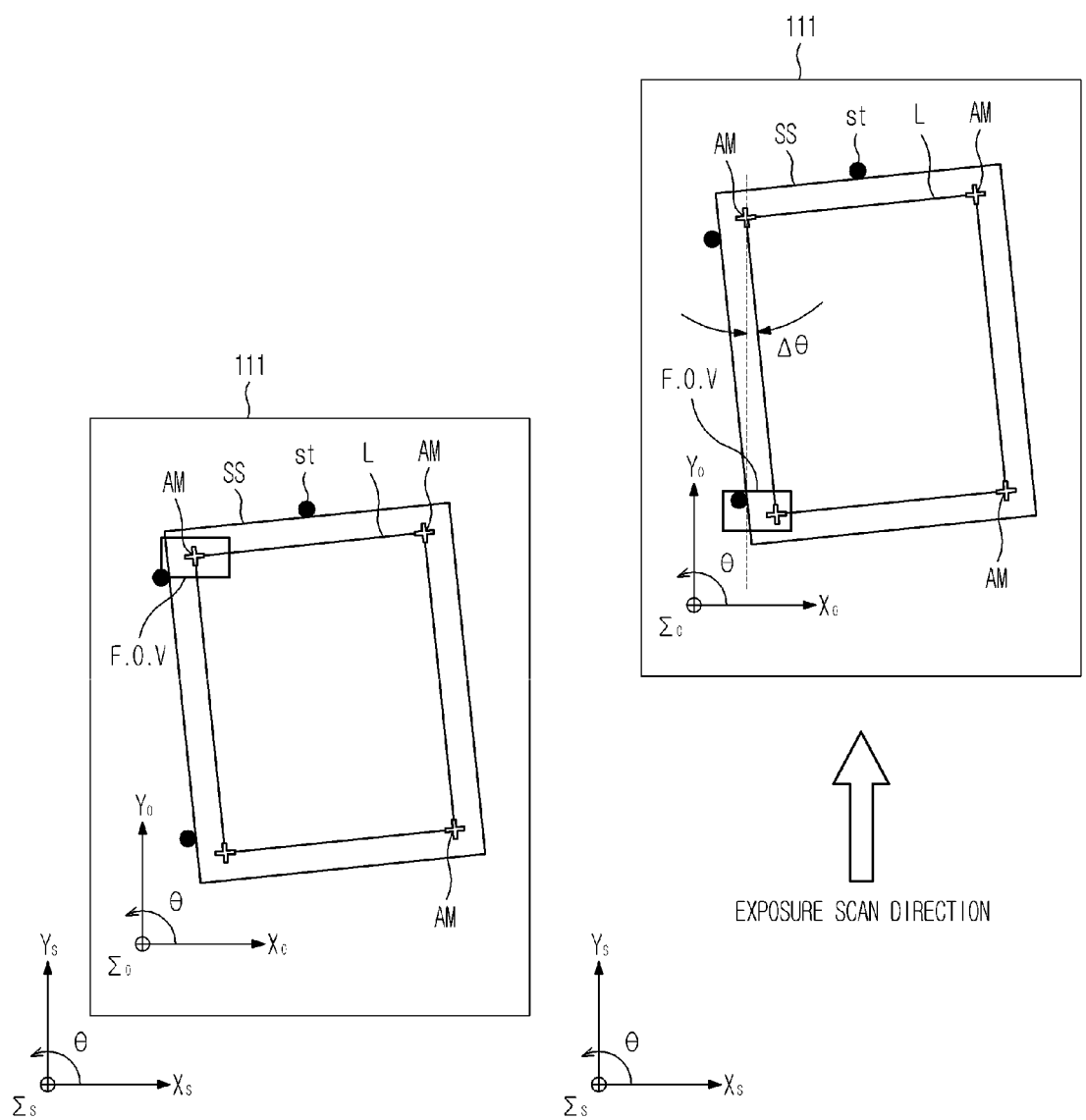
FIG. 11 is a view illustrating a procedure to acquire a relative orientation difference by conveying a moving table in an exposure scan direction in maskless lithography according to an example embodiment.

FIG. 11 illustrates an alternative method different from the method of FIG. 10, to acquire an orientation difference between a nominal or desired exposure start orientation and an obtained exposure start orientation.

FIG. 11 is a view illustrating a procedure to acquire a relative orientation difference $\Delta\theta$ by conveying a moving table in an exposure scan direction in maskless lithography according to an example embodiment.

In FIG. 11, the reference substrate SS is loaded on the moving table 111 and the moving table 111 is conveyed in a given direction (for example, an exposure scan direction, or a direction perpendicular to the exposure scan direction), such that the two or more alignment marks AM formed on the reference substrate SS placed on the moving table 111 are measured to acquire a relative orientation difference $\Delta\theta$. Here, $\Delta\theta$ is a relative angle difference, and thus, there is no difference between the overlay coordinate system $\Sigma_o$ and the stage coordinate system $\Sigma_{MS}$.

Figure 12:
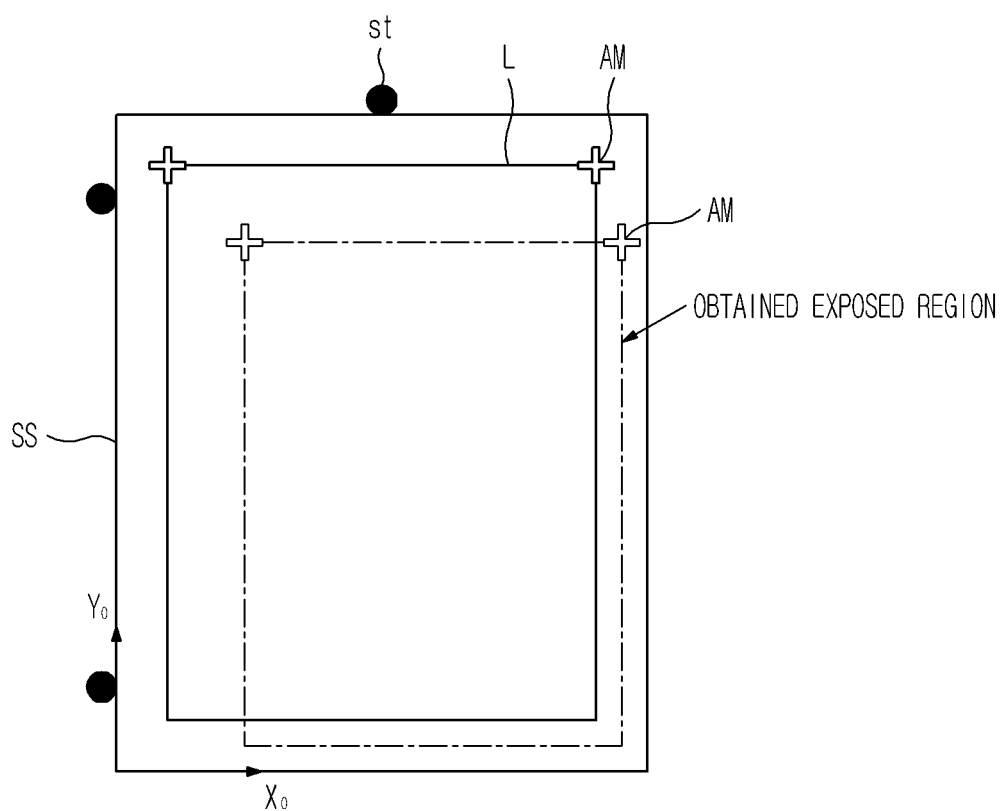
FIG. 12 is a view illustrating the result confirmed by loading, exposing and developing a reference substrate after compensation of a relative orientation difference in maskless lithography according to an example embodiment.

FIG. 12 is a view illustrating the result confirmed by loading, exposing and developing the reference substrate SS after compensation of the relative orientation difference $\Delta\theta$ in maskless lithography according to an example embodiment.

Confirming the result of repeatedly exposing and developing the reference substrate SS after compensating for the relative orientation difference $\Delta\theta$ from the nominal or desired exposure start orientation acquired via Equation 1, it will be appreciated that an obtained exposure start orientation coincides with a nominal or desired exposure start orientation as illustrated in FIG. 12.

Figure 13:
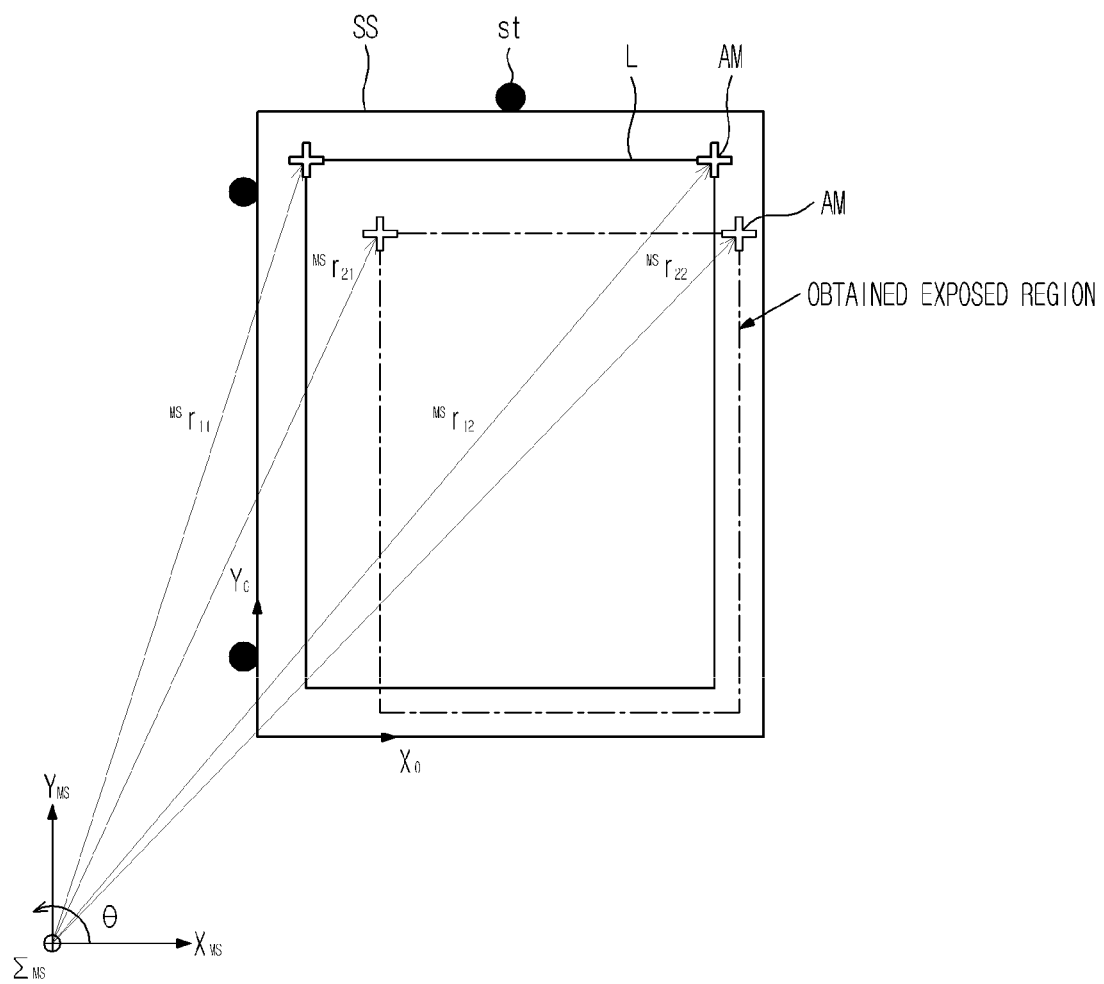
FIG. 13 is a first view defining a position vector of a mark and a coordinate system with respect to the result of FIG. 12.
Figure 14:
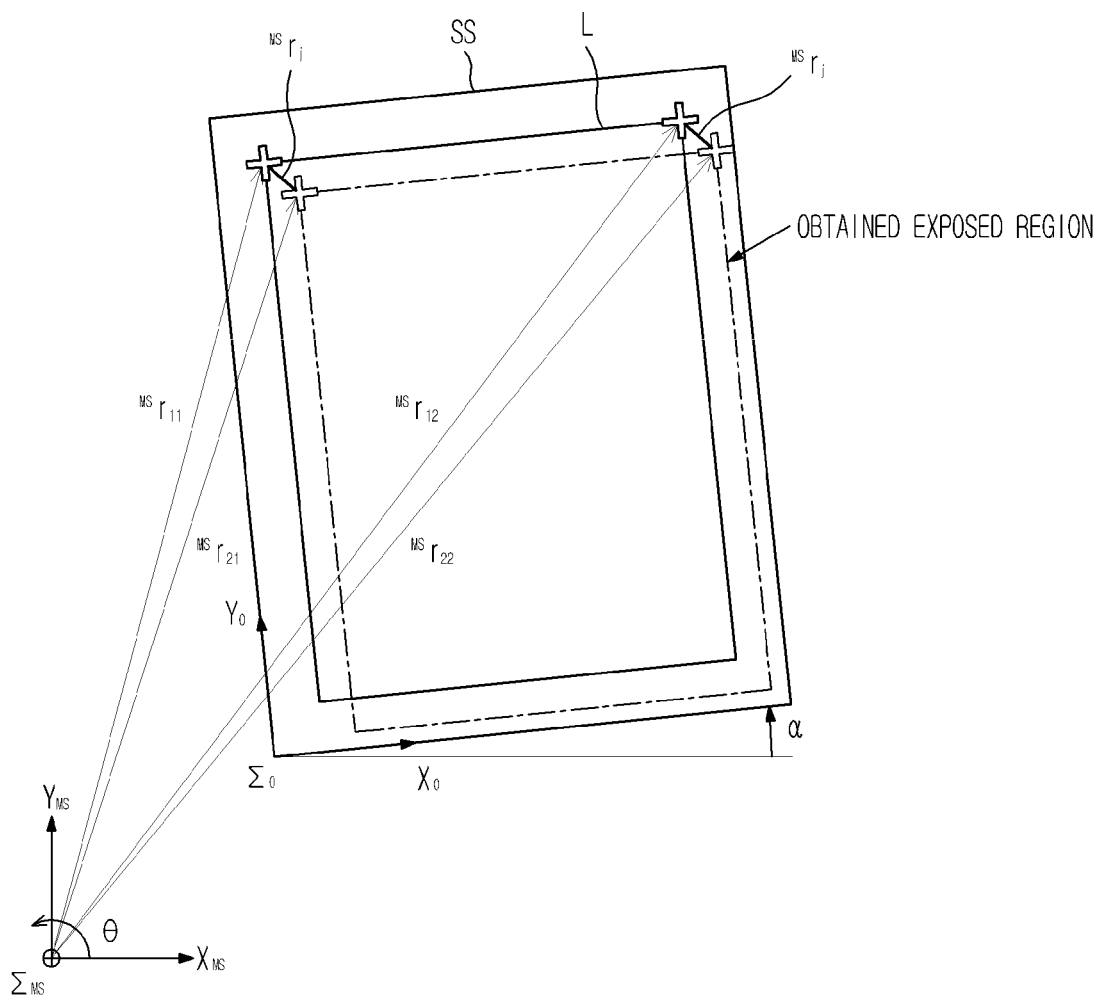
FIG. 14 is a second view defining a position vector of a mark and a coordinate system with respect to the result of FIG. 12.
Figure 15:
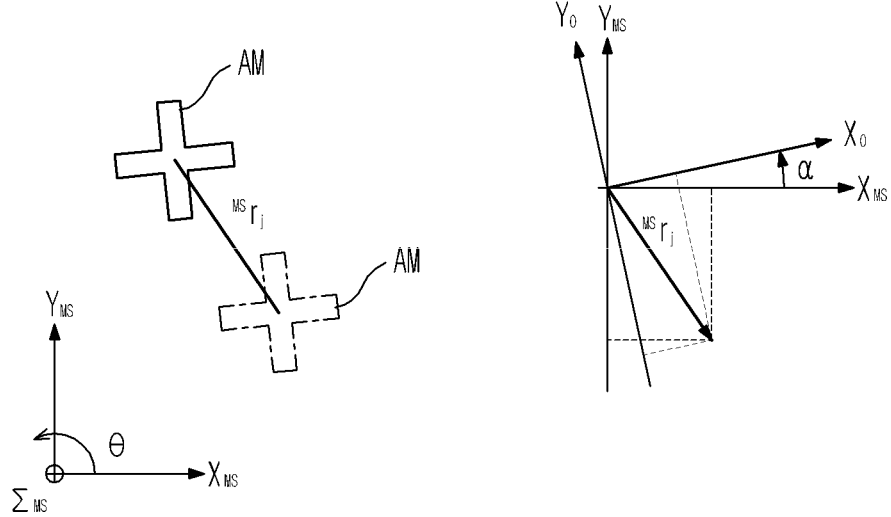
FIG. 15 is a view illustrating switching between an overlay coordinate system $\Sigma_o$ and a measurement coordinate system $\Sigma_{MS}$ in FIGS. 13 and 14.

FIG. 13 is a first view defining a position vector of a mark and a coordinate system with respect to the result of FIG. 12. FIG. 14 is a second view defining a position vector of a mark and a coordinate system with respect to the result of FIG. 12. FIG. 15 is a view illustrating switching between an overlay coordinate system $\Sigma_o$ and a measurement coordinate system $\Sigma_{MS}$ in FIGS. 13 and 14.

In FIGS. 13 to 15, after the reference substrate SS, which has subjected to loading, exposure and developing processes, is placed on the measurement system 10, positions of the alignment marks AM previously patterned on the reference substrate SS and the newly patterned alignment marks AM are measured using the measurement unit 140.

FIG. 14 illustrates a general case in which the developed reference substrate SS is turned by an angle $\alpha$ when being loaded on the measurement system 10, and the angle $\alpha$ may be acquired via the following Equation 2.

$$\alpha = \arg({}^{MS}r_{12} - {}^{MS}r_{11}) = \arg({}^{MS}r_{22} - {}^{MS}r_{21}) = \quad \text{Equation 2}$$

Next, a difference between a nominal or desired exposure start position and an obtained position may be acquired via the following Equation 3 using the angle $\alpha$ and the positions ${}^{MS}r_{12}$, ${}^{MS}r_{11}$, ${}^{MS}r_{22}$, and ${}^{MS}r_{21}$ of the respective alignment marks AM measured based on the measurement coordinate system $\Sigma_{MS}$.

$$\begin{aligned}{}^{MS}r_j &= {}^{MS}r_{2j} - {}^{MS}r_{1j} = {}^{MS}\begin{bmatrix}\Delta X_j \\ \Delta Y_j\end{bmatrix}, \\ {}^{o}r_j &= {}^{o}\begin{bmatrix}\Delta X_j \\ \Delta Y_j\end{bmatrix} \\ {}^{MS}r_j &= R(\alpha) \cdot {}^{o}r_j \Rightarrow {}^{o}r_j \\ &= R^{-1}(\alpha) \cdot {}^{MS}r_j \\ &= R(-\alpha) \cdot {}^{MS}r_j\end{aligned} \quad \text{Equation 3}$$

In Equation 3, "${}^{MS}r_j$" is a relative displacement between the $j^{th}$ alignment marks AM measured based on the measurement coordinate system $\Sigma_{MS}$, and "${}^{o}r_j$" is a relative displacement between the $j^{th}$ alignment marks AM measured based on the overlay coordinate system $\Sigma_o$.

Also, the following relationship is fulfilled:

$$R(\alpha) = \begin{bmatrix}\cos\alpha & -\sin\alpha \\ \sin\alpha & \cos\alpha\end{bmatrix},$$

$$R(-\alpha) = \begin{bmatrix}\cos\alpha & \sin\alpha \\ -\sin\alpha & \cos\alpha\end{bmatrix}.$$

Accordingly, an exposure start relative position difference ${}^{o}r_j(\Delta X_j, \Delta Y_j)$ based on the overlay coordinate system $\Sigma_o$ may be calculated via the following Equation 4.

$$^{o}\begin{bmatrix}\Delta X_j \\ \Delta Y_j\end{bmatrix} = \begin{bmatrix}\cos\alpha & \sin\alpha \\ -\sin\alpha & \cos\alpha\end{bmatrix} \cdot {}^{MS}\begin{bmatrix}\Delta X_j \\ \Delta Y_j\end{bmatrix} \quad \text{Equation 4}$$

In Equation 4, by comparing positions of n alignment marks AM, an average value may be acquired via the following Equation 5 to enhance reliability.

$$\Delta X = \frac{1}{n}\sum_{j=1}^{n} {}^{o}[\Delta X_j] \quad \text{Equation 5}$$

$$\Delta Y = \frac{1}{n}\sum_{j=1}^{n} {}^{o}[\Delta Y_j]$$

As described above, after compensation of the exposure start orientation using the relative orientation difference $\Delta\theta$ acquired via Equation 1, the reference substrate SS is subjected to loading, exposure and developing processes, and positions of the previously patterned alignment marks AM and the newly patterned alignment marks AM are measured using the measurement system 10, so as to acquire a relative position difference $\Delta X$ and $\Delta Y$ using the kinematic relationship between the respective positions.

Next, a procedure to determine an obtained exposure start position and orientation by compensating for the acquired relative orientation difference $\Delta\theta$ and the relative position difference $\Delta X$ and $\Delta Y$ from a nominal or desired exposure start position and orientation will be described with reference to FIG. 16.

Figure 16:
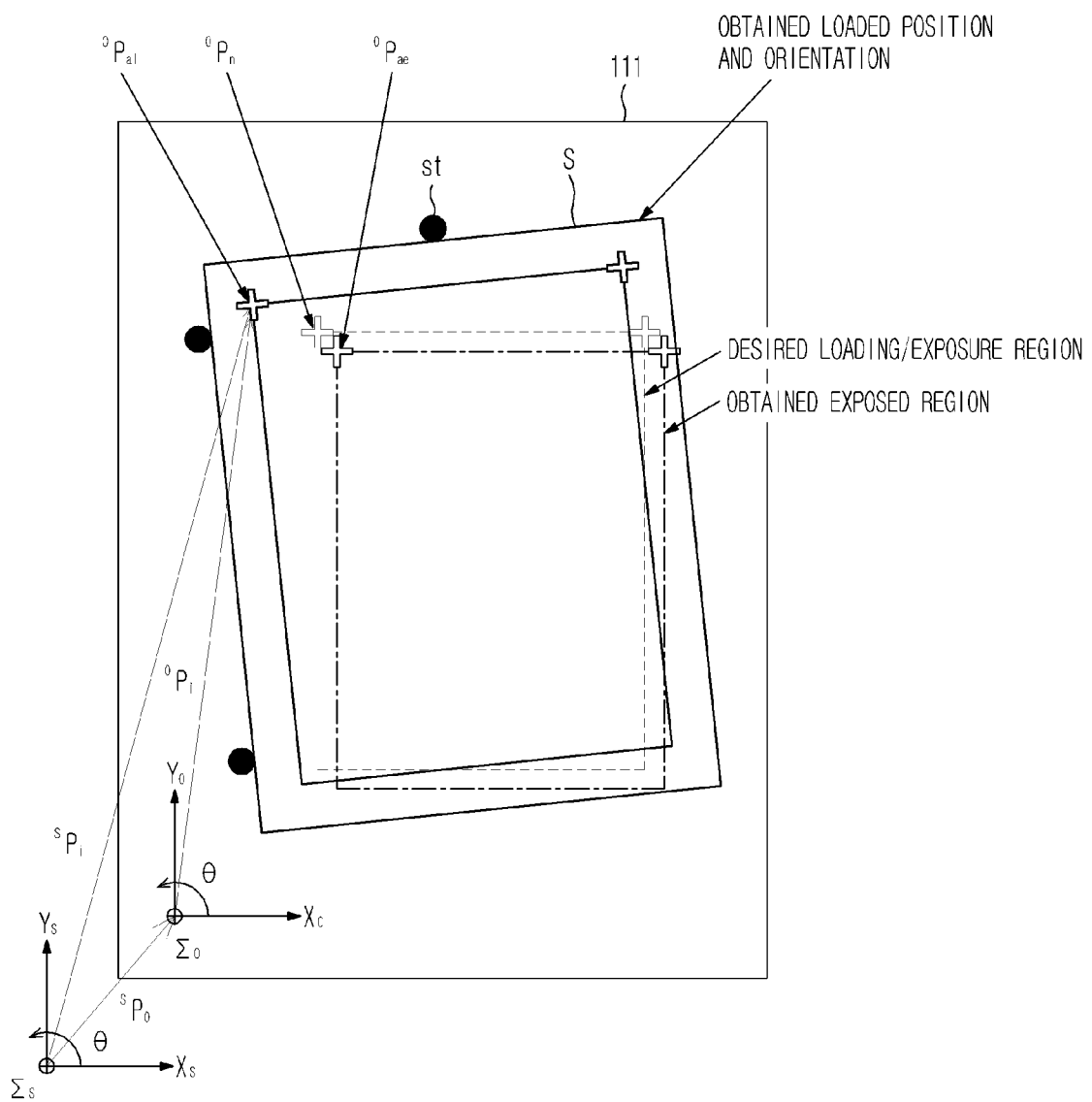
FIG. 16 is a view defining position and orientation vectors in maskless lithography according to an example embodiment.

FIG. 16 is a view defining position and orientation vectors in maskless lithography according to an example embodiment.

In FIG. 16, physical parameters defined for compensating for a difference between an obtained position and orientation and a nominal or desired exposure start position and orientation are as follows.

"${}^{o}P$" is a position and orientation based on the overlay coordinate system $\Sigma_o$, "${}^{s}P$" is a position and orientation based on the stage coordinate system $\Sigma_S$, and "al" is an obtained loaded position, "n" is a desired loaded/exposed position, and "ae" is an obtained exposed position.

Position and orientation vectors of the alignment mark AM based on the stage coordinate system are defined via the following Equation 6.

$$^{s}p_i = {}^{s}p_o + {}^{o}p_i (i = al, n, ae) \quad \text{Equation 6}$$

In Equation 6, the following relationship is fulfilled:

$$^{o}p_{al} = \begin{bmatrix} ^{o}r_{al} \\ \theta_{al} \end{bmatrix} = \begin{bmatrix} X_{al} \\ Y_{al} \\ \theta_{al} \end{bmatrix}, \; ^{s}p_{al} = \begin{bmatrix} ^{s}r_{al} \\ \theta_{al} \end{bmatrix} = \begin{bmatrix} X_{al} \\ Y_{al} \\ \theta_{al} \end{bmatrix}$$

$$^{o}p_{n} = \begin{bmatrix} ^{o}r_{n} \\ \theta_{n} \end{bmatrix} = \begin{bmatrix} X_{n} \\ Y_{n} \\ \theta_{n} \end{bmatrix}, \; ^{s}p_{n} = \begin{bmatrix} ^{s}r_{n} \\ \theta_{n} \end{bmatrix} = \begin{bmatrix} X_{n} \\ Y_{n} \\ \theta_{n} \end{bmatrix}$$

$$^{o}p_{ae} = \begin{bmatrix} ^{o}r_{ae} \\ \theta_{ae} \end{bmatrix} = \begin{bmatrix} X_{ae} \\ Y_{ae} \\ \theta_{ae} \end{bmatrix}, \; ^{s}p_{ae} = \begin{bmatrix} ^{o}r_{ae} \\ \theta_{ae} \end{bmatrix} = \begin{bmatrix} X_{ae} \\ Y_{ae} \\ \theta_{ae} \end{bmatrix}.$$

"$^{s}P_{o}$" is a distance vector from center coordinates of the overlay coordinate system $\Sigma_{o}$ with respect to the stage coordinate system $\Sigma_{MS}$.

Accordingly, assuming that a command value of the moving table 111 of the stage 110 with respect to an exposure start position and orientation is $^{s}P_{cmd}$, a command value $^{s}P_{cmd}$ before compensation and a command value $^{s}P'_{cmd}$ after compensation differ from each other as expressed in the following Equation 7 and Equation 8.

$$^{s}p_{cmd} = \; ^{s}p_{n} = \begin{bmatrix} X_{n} \\ Y_{n} \\ \theta_{n} \end{bmatrix} \quad \text{Equation 7}$$

$$^{s}p'_{cmd} = \; ^{s}p_{cmd} + \begin{bmatrix} \Delta X \\ \Delta Y \\ \Delta \theta \end{bmatrix} \quad \text{Equation 8}$$

$$= \; ^{s}p_{n} + \begin{bmatrix} \Delta X \\ \Delta Y \\ \Delta \theta \end{bmatrix}$$

$$= \begin{bmatrix} X_{n} \\ Y_{n} \\ \theta_{n} \end{bmatrix} + \begin{bmatrix} \Delta X \\ \Delta Y \\ \Delta \theta \end{bmatrix}$$

The relationship of $^{s}[\Delta X, \Delta Y, \Delta \theta]^{T} = \; ^{o}[\Delta X, \Delta Y, \Delta \theta]^{T} = [\Delta X, \Delta Y, \Delta \theta]^{T}$ is fulfilled, and therefore, $^{o}[\Delta X, \Delta Y, \Delta \theta]^{T}$ acquired by Equation 1 and Equation 4 may be used as a compensation value with respect to the stage coordinate system $\Sigma_{MS}$.

In this way, position and orientation differences $[\Delta X, \Delta Y, \Delta \theta]^{T}$ from a nominal or desired exposure start position and orientation may be compensated to determine an obtained exposure start position and orientation.

As is apparent from the above description, in a maskless exposure apparatus and a method to determine an exposure start position and orientation in maskless lithography according to an example embodiment, a difference between an orientation of a substrate loaded on the apparatus and an exposure scan direction (orientation) upon loading/unloading of the substrate may be compensated by a method of determining and compensating for a difference between nominal or desired values and an obtained exposure start position and orientation measured after assembly of equipment. Further, in consideration of a limited stroke within each degree of freedom in another exposure apparatus for Machine-to-Machine Overlay (MMO) or Multi-Machine Overlay (MMO) in maskless lithography, the exposure start position and orientation may be set within an allowable angular stroke, providing exposure compatibility with another exposure apparatus for implementation of MMO.

In addition, considering that it may not be possible to visually confirm UV laser light for formation of a pattern with the naked eye, it may be possible to systematically locate and determine an exposure start position and orientation obtained in each of a plurality of optical systems on a per equipment basis. The equipment may be suitable for mass production, may be easy to use, may require fewer repairs and may be relatively easy to maintain.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method to determine an exposure start position and orientation comprising:
   loading a substrate, on which is patterned at least one alignment mark of a first set of alignment marks of a first pattern layer, on a moving table;
   exposing the substrate, using maskless lithography, to form at least one alignment mark of a second set of alignment marks of a second pattern layer on the substrate;
   measuring a position of the at least one alignment mark of the first set of alignment marks and a position of the at least one alignment mark of the second set of alignment marks on the substrate;
   acquiring a relative orientation difference between a desired exposure start orientation and an obtained exposure start orientation using the measured positions of the at least one alignment mark of the first set of alignment marks and the at least one alignment mark of the second set of alignment marks;
   acquiring a relative position difference between a desired exposure start position and an obtained exposure start position using the measured positions of the at least one alignment mark of the first set of alignment marks and the at least one alignment mark of the second set of alignment marks;
   determining an exposure start position and orientation compensated using the relative position difference and the relative orientation difference;
   compensating for the exposure start orientation of the substrate using the relative orientation difference;
   repeatedly loading and exposing the substrate after compensating for the exposure start orientation of the substrate; and
   measuring a position of the at least one alignment mark of the first set of alignment marks and a position of the at least one alignment mark of the second set of alignment marks on the substrate after completion of the repeated exposure of the substrate.

2. The method according to claim 1, further comprising:
   providing as the substrate at least one of a reference substrate having the first pattern layer thereon, and a substrate exposed to the first pattern layer in a separate exposure apparatus for Multi Machine Overlay (MMO).

3. The method according to claim 2, further comprising:
   providing the first pattern layer including information required to locate the exposure start position and orientation.

4. The method according to claim 1, wherein the acquiring the relative orientation difference between the desired exposure start orientation and the obtained exposure start orientation using the measured positions of the at least one alignment mark of the first set of alignment marks and the at least one alignment mark of the second set of alignment marks includes, acquiring a difference between the desired exposure start orientation and the obtained exposure start orientation after assembly of exposure equipment based on the equation $$\Delta\theta = -[\arg(^{MS}r_{12} - {}^{MS}r_{11}) - \arg(^{MS}r_{22} - {}^{MS}r_{21})] \text{w.r.t} \Sigma_0 \quad 5$$

wherein,

"$^{MS}r_{12}$" is a position of a first alignment mark of the first set of alignment marks of the first pattern layer, the position of the first alignment mark of the first set of alignment marks being measured based on a measurement coordinate system, "$^{MS}r_{11}$" is a position of a second alignment mark of the first set of alignment marks of the first pattern layer, the position of the second alignment mark of first set of alignment marks being measured based on the measurement coordinate system, "$^{MS}r_{22}$" is a position of a first alignment mark of the second set of alignment marks of the second pattern layer, the position of the first alignment mark of the second set of alignment marks being measured based on the measurement coordinate system, and "$^{MS}r_{11}$" is a position of a second alignment mark of the second set of alignment marks of the second pattern layer, the position of the second alignment mark of the second set of alignment marks being measured based on the measurement coordinate system.

5. The method according to claim 1, wherein the acquiring the relative position difference between the desired exposure start position and the obtained start position using the measured positions of the at least one alignment mark of the first set of alignment marks and the at least one alignment mark of the second set of alignment marks includes, acquiring a difference between the desired exposure start position and the obtained exposure start position after assembly of equipment based on the kinematic relationship between the repeatedly measured positions of the at least one alignment mark of the first set of alignment marks and the at least one alignment mark of the second set of alignment marks.

6. The method according to claim 5, further comprising:
compensating for a difference between the desired exposure start position and orientation and the obtained exposure start position and orientation after assembly of the exposure equipment and after exposing the at least one alignment mark of the first set of alignment marks on the first pattern layer.

7. The method according to claim 6, further comprising:
compensating for the difference between the desired exposure start position and orientation and the obtained exposure start position and orientation after assembly of the exposure equipment and after exposing a pattern layer on another substrate on which an alignment mark is not formed.

8. The method according to claim 5, wherein the determining the exposure start position and orientation compensated using the relative position difference and the relative orientation difference includes, acquiring a compensation command value with respect to the obtained exposure start position and orientation using the following equations by compensating for a desired command value with respect to the obtained start position and orientation using the relative position and orientation differences:

$$^s p_{cmd} = {}^s p_n = \begin{bmatrix} ^s X_n \\ Y_n \\ \theta_n \end{bmatrix},$$

$$^s p'_{cmd} = {}^s p_{cmd} + \begin{bmatrix} \Delta X \\ \Delta Y \\ \Delta \theta \end{bmatrix} = {}^s p_n + \begin{bmatrix} \Delta X \\ \Delta Y \\ \Delta \theta \end{bmatrix} = \begin{bmatrix} ^s X_n \\ Y_n \\ \theta_n \end{bmatrix} + \begin{bmatrix} \Delta X \\ \Delta Y \\ \Delta \theta \end{bmatrix}.$$

9. A maskless exposure apparatus, comprising:
a stage configured to receive a substrate on a moving table thereof and move the substrate in X-, Y- and θ-directions, the substrate including a pattern layer;
a light modulation element configured to expose the pattern on the substrate using a beam spot array of exposure beams;
a measurement system configured to measure a position of an alignment mark previously patterned on the substrate and a position of an alignment mark of the pattern exposed on the substrate; and
a control unit configured to,
acquire a relative orientation difference between a desired exposure start orientation and an obtained orientation using the measured positions of the alignment marks and a relative position difference between a desired exposure start position and an obtained position using the measured positions of the alignment marks,
determine an exposure start position and orientation compensated using the relative orientation difference and the relative position difference,
compensate for the exposure start orientation of the substrate using the relative orientation difference,
load and expose the substrate after compensating for the exposure start orientation of the substrate, and
measure a position of the previously patterned alignment mark on the substrate and a position of the exposed alignment mark on the substrate after completion of the loading and exposing of the substrate.

10. The apparatus according to claim 9, wherein the substrate includes at least one of a reference substrate having the pattern layer and a substrate exposed to the first pattern layer in a separate exposure apparatus for Multi Machine Overlay (MMO).

11. The apparatus according to claim 10, wherein the substrate having the pattern layer includes pattern information required to locate the exposure start position and orientation.

12. The apparatus according to claim 9, wherein the measurement system includes at least one of a non-contact Coordinate Measuring Machine (CMM) and an Alignment Scope Unit (ASU).

* * * * *